United States Patent [19]

Pitches et al.

[11] 4,392,378
[45] Jul. 12, 1983

[54] CAPACITANCE MEASURING APPARATUS

[75] Inventors: Brian E. Pitches, Lothian; Robert M. S. Murray, Edinburgh; Douglas J. Rogers, Midlothian, all of Scotland

[73] Assignee: 501 Ferranti Limited, Hellinwood, England

[21] Appl. No.: 180,885

[22] Filed: Aug. 25, 1980

[30] Foreign Application Priority Data

Sep. 1, 1979 [GB] United Kingdom ................. 7930387

[51] Int. Cl.³ ....................... G01F 23/26; G01R 27/26
[52] U.S. Cl. ................................. 73/304 C; 307/118; 307/355; 324/61 R
[58] Field of Search .............. 73/304 C; 307/308, 355, 307/118

[56] References Cited

U.S. PATENT DOCUMENTS

| | | | |
|---|---|---|---|
| 2,710,541 | 6/1955 | Miller | 73/304 C |
| 2,866,337 | 12/1958 | Minneman et al. | 73/304 C |
| 2,896,454 | 7/1959 | Storm et al. | 73/304 C |
| 2,899,825 | 8/1959 | Adams et al. | 73/304 C |
| 3,037,385 | 6/1962 | Franzel et al. | 73/304 C |
| 4,048,525 | 9/1977 | Goldberg et al. | 307/355 |
| 4,214,479 | 7/1980 | Maier | 73/304 C |
| 4,222,267 | 9/1980 | Aldrich | 73/304 C |
| 4,235,106 | 11/1980 | Maltby et al. | 73/304 C |
| 4,245,188 | 1/1981 | Rottmar | 73/304 C |

OTHER PUBLICATIONS

Publ. "The Operation and Use of a Fast Integrated Circuit Comparator" R. J. Wilder, Fairchild Semiconductors, 1966.

Primary Examiner—Daniel M. Yasich
Attorney, Agent, or Firm—Kerkam, Stowell, Kondracki & Clarke

[57] ABSTRACT

Capacitance measuring apparatus comprises a variable capacitor VC and a reference capacitor FC. Circuits D, ID, are provided for generating a periodic waveform for application directly to the variable capacitor, and in inverted form to the reference capacitor. Switches means SM are operated by control logic CL to connect the two capacitors in sequence to the input of an integrating amplifier IA, the output of which is applied to a comparator CM to which is also applied a reference level. The output of the comparator controls the control logic. Output of the control logic is converted to an indication of the capacitance of the variable capacitor relative to that of the reference capacitor.

8 Claims, 5 Drawing Figures

CAPACITANCE MEASURING APPARATUS

This invention relates to capacitance measuring apparatus, and particularly, though not exclusively, to such apparatus used for the measurement of the depth of a liquid in a container.

There are many ways of measuring the depth of a liquid in a container. However, if the container is buried, as in the case for example of fuel storage tanks, then a number of these methods are no longer available. A commonly-used method in such instances involves the use of a calibrated dip-stick. However, this involves obtaining access to the tank and removing the cover. With the increased popularity of remotely-operated self-service filling stations there is a requirement for an automatic and remotely-operated measuring system.

The use of capacitive gauges is known, in which a pair of concentric tubes extend the full depth of the tank and form a capacitor the capacitance of which is dependent upon the depth of the fuel in the tank. Such a capacitive probe may form one element of a conventional a.c. measuring bridge. If an installation consists of a number of storage tanks, as is usual, then a single bridge may be used, switching in the appropriate probe as required. The major disadvantage of such a system is that the relatively long lines necessary to connect each probe to the common apparatus are possible sources of error due to their own capacitance or to external pick-up. In addition, such a system is unable to compensate for changes in the dielectric constant of the liquid, Similar techniques may be used in other applications, such as the measurement of displacement, strain and load by capacitive means. Again, if measurements are made at a number of points using a common bridge then the same sources of error are present.

It is an object of the invention to provide capacitance measuring apparatus of the type referred to which does not suffer from the above disadvantages.

According to the present invention there is provided capacitance measuring apparatus which includes a variable capacitor and a reference capacitor, means for generating a periodic waveform for application directly to the variable capacitor and in inverted form to the reference capacitor, an integrator, switching means operable to connect the variable capacitor and the reference capacitor sequentially to the input of the integrator, comparison means operable to compare the output of the integrator with a reference level, control means responsive to the output of the comparison means to control the sequence of operation of the switching means and to deliver an output pulse train, and output means responsive to the output pulse train to determine the capacitance of the variable capacitor relative to that of the reference capacitor.

According to one aspect of the invention the variable capacitor may be immersed in a dielectric liquid such that the apparatus is operable to determine the depth of the liquid.

According to another aspect of the invention the apparatus may include two reference capacitors defining upper and lower limits respectively, the switching means being operable to connect to the input of the integrator the variable capacitor and one or other of the two reference capacitors, in a predetermined sequence.

An embodiment of the invention will now be described with reference to the accompanying drawings in which.

Figure 1:
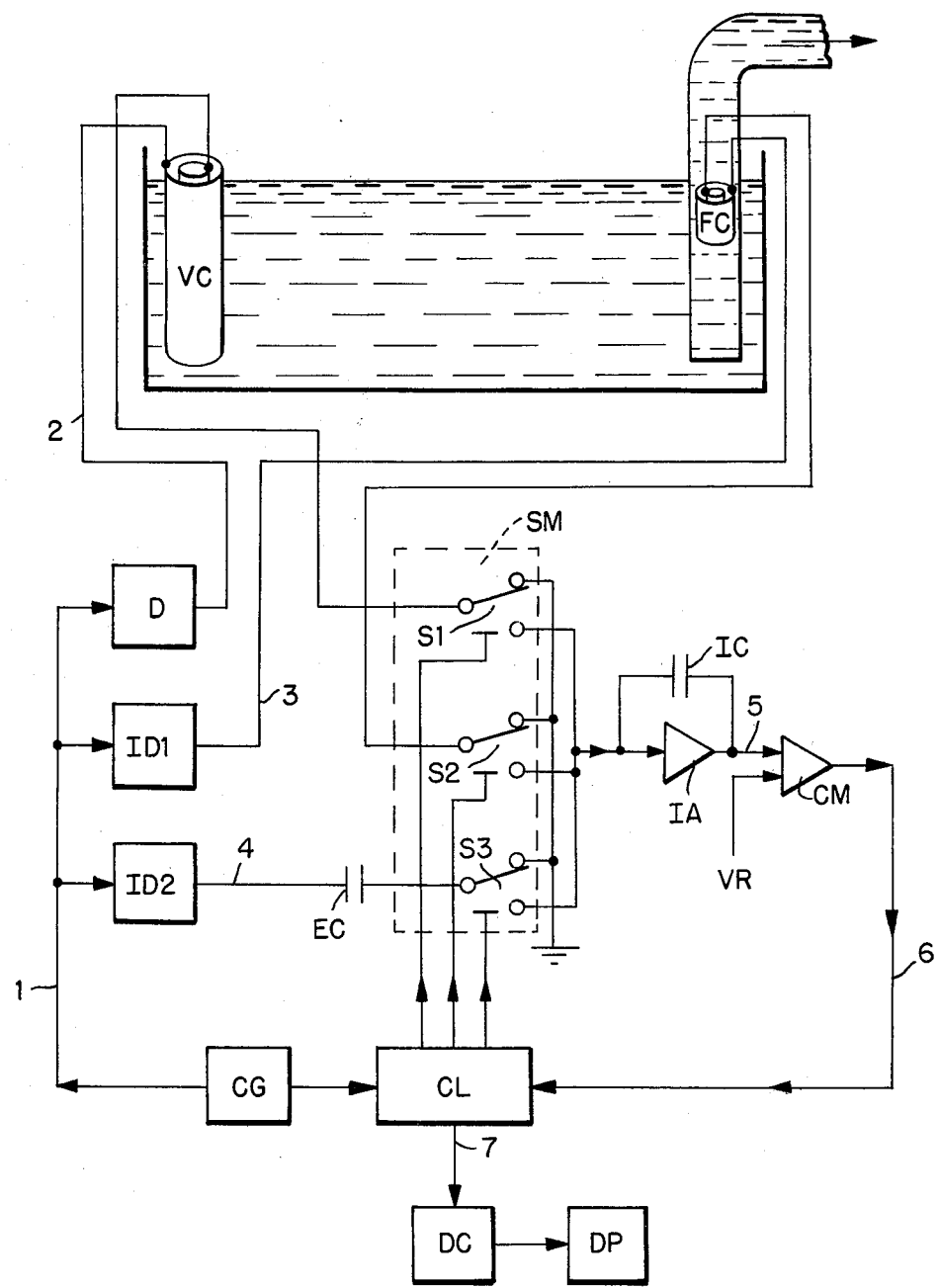
FIG. 1 is a schematic block diagram of liquid depth-measuring apparatus.

Referring now to FIG. 1, a variable capacitor VC is located in a tank arranged to contain a dielectric liquid such as petrol. The capacitor comprises two concentric conducting tubes mounted vertically and maintained at a constant spacing by insulating spacers. The actual capacitance of the capacitor VC will depend upon the depth of the petrol in the tank. A second capacitor, the "full" reference capacitor FC is of similar construction and is located in the suction pipe from the tank such that it is always completely immersed in petrol such that its capacitance is close to that of the variable capacitor VC when the tank is full. A third capacitor, the "empty" reference capacitor EC is provided in the form of a conventional capacitor having a value which is close to that or the variable capacitor when the tank is empty, of as near to being empty as can be permitted.

A central clock generator CG generates a continuous train of clock pulses which is used to control three drive circuits. One of these, drive circuit D, develops a continuous periodic voltage waveform which is applied to one electrode of the variable capacitor VC. An inverting drive circuit ID1 generates a similar voltage waveform of opposite polarity which is applied to the "full" reference capacitor FC. Similarly a second inverting drive circuit ID2 produces the same inverted waveform for application to the "empty" reference capacitor EC. The other electrode of each of the three capacitors is connected to the pole of a separate changeover switch, one contact of each switch being connected to earth potential. Thus variable capacitor VC is connected to switch S1 which has its normally-closed contact connected to earth potential. Similarly capacitor FC is connected to switch S2, and capacitor EC is connected to switch S3, both switches also having their normally-closed contact connected to earth potential. The three switches S1, S2 and S3 make up the switching means of the invention, and are controlled by control logic CL to be described later.

The normally-open contact of each of the three switches is connected to a common point, this being the "virtual earth" point of an integrator comprising amplifier IA and capacitor IC. The output of the integrator is connected to one input of a comparator CM having a reference voltage $V_R$ applied to it. The output of the comparator CM is connected to the control logic CL, as is the output of the clock pulse generator CG.

All of the apparatus so far described is located at the petrol tank. Apart from the two capacitors VC and FC actually located in the tank, the other components may be located on a single printed circuit board inside a box attached to one of the two tank-mounted capacitors. Hence if several tanks are present, each will be fitted with all of the components described above.

The remainder of the apparatus may be remotely located, and comprises a decoder DC and some form of display DP.

Figure 2:
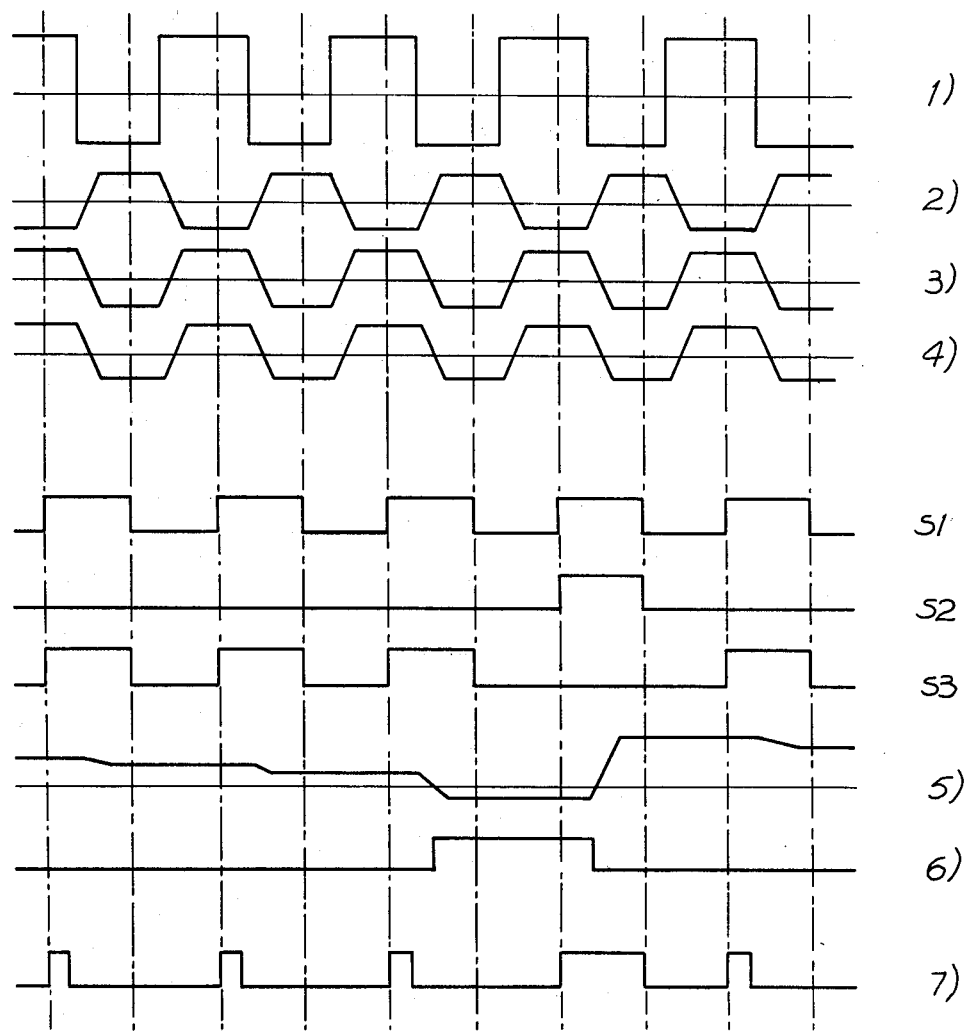
FIG. 2 illustrates voltage waveforms appearing in the circuit of FIG. 1.

FIG. 2 illustrates the voltage waveforms produced at certain points of the circuit of FIG. 1, the points being indicated by numbers in circles. The number corresponds to that of the appropriate waveform in FIG. 2. In addition FIG. 2 includes diagrams showing the timing of the switch operation.

Referring now to FIGS. 1 and 2, the output from the clock pulse generator CG is a square wave as shown at (1) in FIG. 2, and this causes the drive circuit D to generate a voltage waveform of truncated triangular shape as shown at (2) in FIG. 2, whilst the inverting drive circuits ID1 and ID2 generate voltages which have the inverse waveform, as shown at (3) and (4) respectively. These voltages are applied to the respective capacitors. The three drive waveforms are generally symmetrical about the zero volts level.

The switching means SM are controlled by the control logic CL in the manner shown at S1, S2 and S3 in FIG. 2, the upper level denoting a switch in the upper condition shown in FIG. 1. At some time switches S1 and S3 are operated simultaneously to connect one side of each of the capacitors VC and VE to the virtual earth point of the integrator. Unless the tank is empty, the charge transferred into the variable capacitor VC is greater than that transferred out of the reference capacitor EC, so that the net charge transferred causes the output of the integrator to fall, as shown at (5) in FIG. 2. At an appropriate point in the cycle the two switches S1 and S3 change over so that the two capacitors are discharged, and the drive voltages return to their previous values.

The control logic CL is arranged so that the low output from the comparator CM results in a short duration output pulse from the control logic at each switching pulse, as shown at (7) in FIG. 2.

If the output from the integrator is still above the reference voltage $V_R$ of the comparator CM, then the two switches S1 and S3 are again operated together, and a further charge transfer takes place. This is repeated for as long as the integrator output remains above $V_R$, and each switch operation results in a short output pulse from the control logic CL.

At some time, the output of the integrator will fall below the reference voltage $V_R$ of the comparator CM. When this occurs, the output from the comparator goes high as shown at (6), the operation of switch S3 ceases, and switch S3 is operated in its place. This results in a simultaneous charge transfer involving capacitors VC and FC. Since capacitor FC represents the "full" condition of the tank, the charge transfer out of this capacitor will be greater than the charge transfer into capacitor VC. Hence the net charge increase will cause the output of the integrator to increase. As shown at (5) in FIG. 2 a single operation of switch S2 is sufficient to increase the output of the integrator from below the comparator reference voltage to above the comparator reference voltage, with the result that the comparator output goes low as shown at (6). The operation of switch S2 causes the control logic CL to produce an output pulse of longer duration each time that switch S2 is operated.

The number of consecutive operations of S2 and S3 depends upon the capacitance of the variable capacitor VC relative to the two reference capacitors FC and EC, and the output of the control logic comprises a pulse train having a succession of short or long pulses. The decoder DC operates by counting a large number N of pulses and determining the number n of long pulses in this total.

It can be shown that, for a sufficiently large value of N, then the capacitance $C_{VC}$ of the variable capacitor is given by $$C_{VC}=C_{EC}+(n/N)(C_{FC}-C_{EC}) \quad (1)$$

where $C_{FC}$ is the capacitance of the "full" reference capacitor FC.

Now the capacitance of the variable capacitor VC equals that of the full reference capacitor FC when full of the dielectric, and equals that of the empty reference capacitor EC when empty of the dielectric. Assuming that the variable capacitor is of uniform characteristics along its length, then its capacitance will vary linearly in proportion to the fraction of its length submerged in the dielectric.

Let D be the total length of the variable capacitor and d the length submerged. Then $$C_{VC}=C_{EC}+(d/D)(C_{FC}-C_{EC}) \quad (2)$$

By comparing equations 1 and 2 it can be seen that $$(n/N)=(d/D)$$

The only mathematical limits of accuracy are due to the fact that both n and N are integers. Hence the overall accuracy of the calculation may be increased by sampling over a longer period of time.

Figure 3:
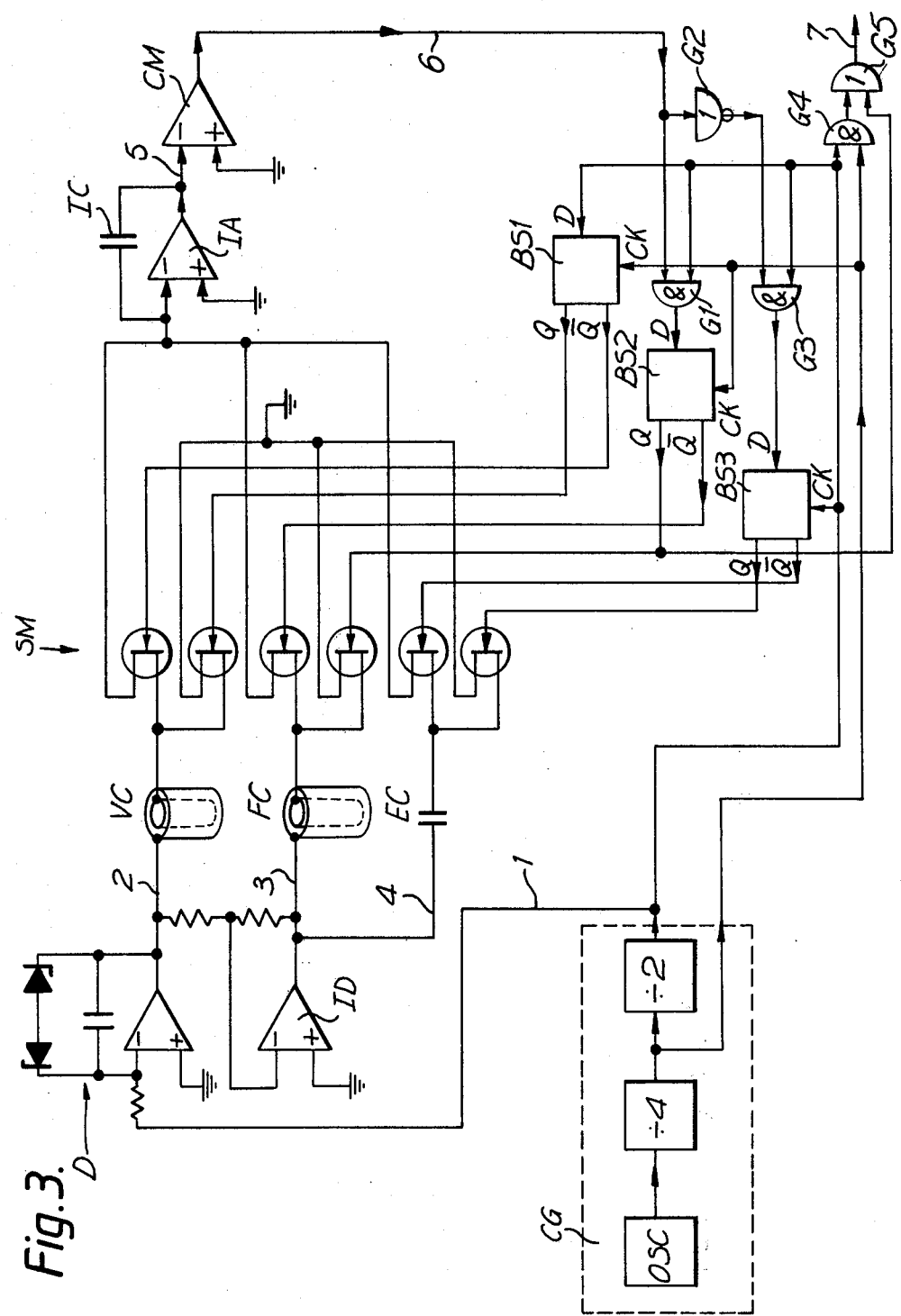
FIG. 3 is a more detailed block diagram of part of the circuit of FIG. 1.

Referring now to FIG. 3, this shows in more detail, one form of the apparatus of FIG. 1, in particular the drive circuits and the control logic.

As shown in FIG. 3, the clock pulse generator comprises an oscillator OSC, having a frequency of, say, 100 KHz, followed by two frequency divider stages, the first producing 3:1 mark-space ratio pulses. The final output, shown at (1) in FIG. 2, is then a 12.5 KHz one-to-one- ratio square wave.

The drive circuit D conveniently takes the form of an operational amplifier, such as the 741 type, with a feedback capacitor and limiting diodes driven by a symmetrical square-wave-through a resistor. This produces the required truncated triangular waveform. The two inverting drive circuits ID1 and ID2 may in fact be a single inverting operational amplifier, again of the 741 type, feeding the two capacitors FC and EC in parallel.

The switching means is shown as three pairs of field-effect transistors, each pair acting as a single changeover switch. The control logic CL, in perhaps its simplest form, comprises a network of gates G1 to G5 and D-type bistable circuits, BS1 to BS3 controlled by the output of the comparator and two timing outputs from the clock pulse generator CG.

The operation of the circuit is as described with reference to FIGS. 1 and 2, with the control logic controlling the switching means SM.

Figure 4:
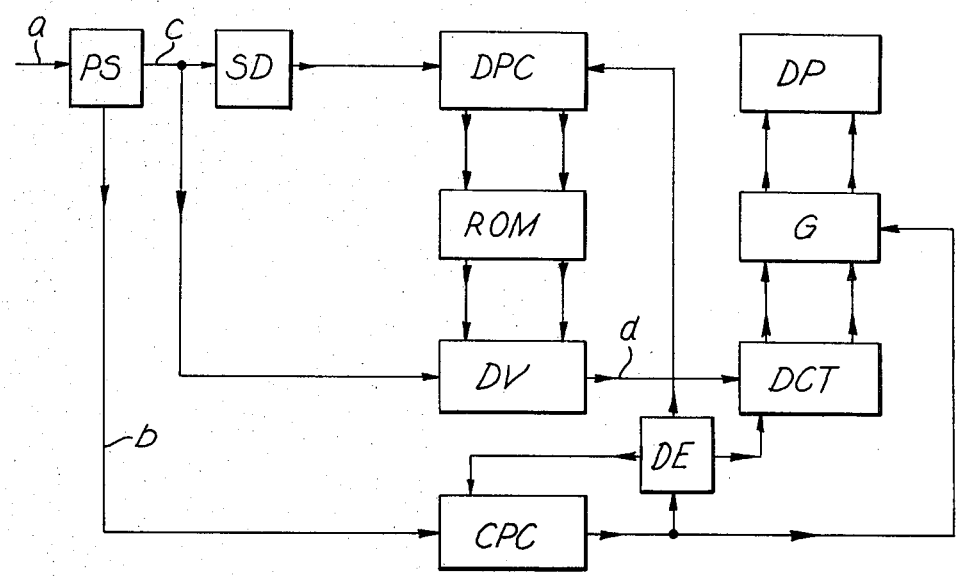
FIG. 4 is a block diagram of the decoder of FIG. 1.

As already stated, the decoder of FIG. 1 functions to determine the number of long pulses present in a given number of total pulses in the output from the control logic CL. FIG. 4 is a block diagram of the decoder, illustrating its operation in more detail. The decoder shown is also arranged to convert the depth measurement into an indication of the quantity of petrol in the tank.

Referring now to FIG. 4, the pulse train output from the control logic CL of FIG. 1 is applied to a pulse separator PS. This operates to separate the short or "clock" pulses from the long or "data" pulses in the pulse chain. It comprises a simple timing circuit, since every pulse which occurs is a clock pulse, whilst every pulse having a longer duration than that of a clock pulse must be a data pulse. Hence the length of every pulse is compared with the length of a standard clock pulse. Clock pulses from the pulse separator PS are passed to a clock pulse counter CTR, which counts a predetermined number of pulses.

The data pulses pass through a scaling divider SD to a data pulse counter DPC. The separate stage outputs of this counter are applied as inputs to a programmable read-only memory ROM. The output of the memory ROM is applied to a pulse divider DV as the divisor, with the data pulse output from the pulse separator as the diviend. The output from the pulse divider DV is applied to a display counter DCT. The output of this counter is applied through a gate G to a display DP, the control input to the gate being provided by the output of the clock pulse counter CPC. A delay element DE, operated by the output of counter CPC, applies reset inputs to the clock pulse counter CPC, the data pulse counter DPC and the display counter DCT after a short delay.

The operation of the decoder and display will now be described with reference to FIG. 5, which shows the waveforms appearing on the circuit of FIG. 4 identified in lower case letters.

Figure 5:
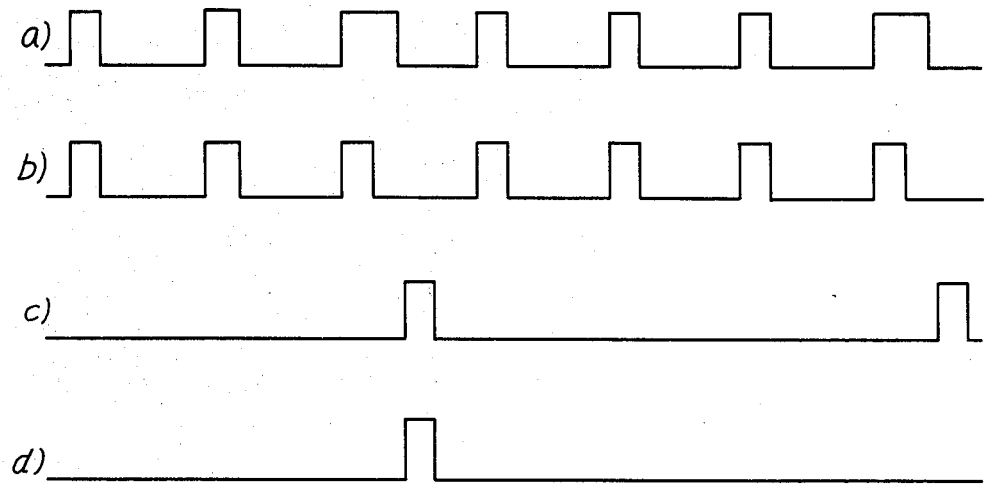
FIG. 5 illustrates voltage waveforms appearing in the circuit of FIG. 4.

FIG. 5(a) shows the pulse output of the control logic CL of FIG. 1, which is applied to the pulse separator PS. The clock pulse output is shown at (b) in FIG. 5, and it is these pulses which are counted by the clock pulse counter CPC. A suitable count for this counter would be, for example, $2^{14}$.

The data pulse output is shown at FIG. 5(c), and after suitable scaling down, say by a factor of $2^6$, is counted in the data pulse counter DPC. Each successive output from the counter represents a small section of the total depth of the tank, and the corresponding output from the memory ROM gives the cross-sectional area of the tank at that depth. The dividing factors of the scaling divider SD and pulse divider DV are arranged to be such that each pulse from the divider DV represents some fraction of a gallon or a liter. These pulses are counted by the display counter, which thus counts the volume of fuel in the tank.

After the predetermined number of clock pulses, the output of counter CPC opens the gate G and applies the output of the display counter DCT to the display DP. The various counters are then reset by the delay element DE, leaving the display set. The procedure is repeated continuously for such time as the display is required.

It is obviously a simple matter to use the decoder and display with a number of depth measuring installations in different tanks, only simple switching being required to display the contents of different tanks.

Various refinements may be fitted to the depth measuring system. Alarms to indicate full, empty, or other preset conditions may be provided, and the apparatus may cycle through a series of tanks, displaying the contents of each in succession, together with the identity of the respective tanks. Test facilities may also be provided.

The capacitance measuring apparatus used in the embodiment described above requires upper and lower limit reference capacitors. However, the apparatus may be modified to use only one reference capacitor, say the lower limit reference EC of FIG. 1. In such a case the upper or "full" reference capacitor FC, switch S2 and inverting driver ID1 are all omitted.

Referring now to FIG. 2, when the drive waveform (1) goes negative and drive waveform (3) goes positive, switches S1 and S3 will both be in the lower position shown in FIG. 1, so that the capacitors are discharged. When the drive waveforms (1) and (3) are reversed, however, only one of switches S1 and S3 is changed to the upper position shown in FIG. 1, as determined by the output of the comparator. Hence, so long as the output voltage of the integrator remains below the reference voltage $V_R$ of the comparator, switch S1 will be operated periodically. Once the integrator voltage exceeds the reference, switch S3 will operate to reduce the charge, resulting in a long pulse in the pulse train output from the control logic.

With this modified system it is possible to determine the capacitance of the variable capacitor VC, with reference to the capacitance of the "empty" reference capacitor CE, by the expression $$C_{VC} = (n/N) \cdot C_{EC}$$

where n and N are as before, and N has a sufficiently large value.

One disadvantage of such a system if used as a tank depth gauge is that it cannot compensate for changes in the dielectric constant of the liquid, since the "empty" reference capacitor CE is a fixed capacitor rather than a probe in the tank.

It will be apparent from the above two equations giving the value of the variable capacitor, that the apparatus may be used for measurements other than the depth of a dielectric liquid. Hence either form of the apparatus described may be used in other applications involving change in capacitance. Displacement gauges, load cells and pressure sensors may all be arranged to operate as variable capacitors, enabling the apparatus to be used to measure displacement, weight or pressure. Other physical quantities may also be measured in a similar manner.

The apparatus described above, particularly with reference to FIG. 3, may be modified whilst still embodying the principle of the invention. For example the switching means SM of FIG. 1 may take different forms, and the control logic CL and decoder DC may take different forms. Alternative switching methods are possible, such as switching in either EC or VC alone in any one cycle.

What we claim is:

1. Capacitance measuring apparatus which includes a variable capacitor and a first reference capacitor, means for generating a periodic voltage waveform for application directly to the variable capacitor and means for generating the periodic waveform in inverted form to the reference capacitor, an integrator, switching means for connecting the variable capacitor and the reference capacitor sequentially to the input of the integrator, comparison means for comparing the output of the integrator with a reference level, control means responsive to the output of the comparison means to control a sequence of operation of the switching means and to deliver an output pulse train, and output means responsive to the output pulse train to determine the capacitance of the variable capacitor relative to that of the reference capacitor.

2. Apparatus as claimed in claim 1 which includes a second reference capacitor, the two reference capacitors defining respectively upper and lower limiting values of the variable capacitor, and in which the switching means is operable to connect to the input of the integrator both the variable capacitor and one or the other of the two reference capacitors, in a predetermined sequence.

3. Apparatus as claimed in either of claims 1 or 2 in which the variable capacitor is arranged to be immersed in a dielectric liquid, the apparatus being operable to determine the depth of the liquid in a tank.

4. Apparatus as claimed in either of claims 1 or 2 in which the output means is operable to convert the measured capacitance into an indication of a physical quantity represented by that capacitance.

5. Apparatus as claimed in claim 1 in which the output of the comparison means may adopt either of two alternative states, the control means being responsive to the output of the comparison means to cause the switching means to operate sequentially according to a first sequence when the output of the comparison means is in one of its two states and according to a second sequence when the output of the commparison means is in the other of its states.

6. Capacitance measuring apparatus which includes a variable capacitor and a first reference capacitor, means for generating a periodic voltage waveform for application directly to the variable capacitor and means for generating the periodic voltage waveform in inverted form to the reference capacitor, an integrator, switching means for connecting the variable capacitor and the reference capacitor sequentially to the input of the integrator, comparison means for comparing the output of the integrator with a reference level, control means responsive to the output of the comparison means to control a sequence of operation of the switching means and to deliver an output pulse train, and output means responsive to the output pulse train to determine the capacitance of the variable capacitor relative to that of the reference capacitor in which the variable capacitor is arranged to be immersed in a dielectric liquid, the apparatus being operable to determine the depth of the liquid in a tank in which the variable capacitor comprises a pair of concentric tubes of electrically-conducting material extending for the full useful depth of the tank.

7. Apparatus as claimed in either of claims 3 or 6 in which the output means is operable to convert the measured capacitance into an indication of the quantity of liquid in the container.

8. Apparatus as claimed in claim 7 in which the output means includes a memory in which are stored predetermined factors for converting capacitance into quantity.

* * * * *